US006995698B2

(12) United States Patent
Suh et al.

(10) Patent No.: US 6,995,698 B2
(45) Date of Patent: Feb. 7, 2006

(54) METHOD AND APPARATUS OF CONVERTING A SERIES OF DATA WORDS INTO MODULATED SIGNALS

(75) Inventors: Sang Woon Suh, Seoul (KR); Jin Yong Kim, Kyunggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/748,221

(22) Filed: Dec. 31, 2003

(65) Prior Publication Data

US 2004/0150536 A1    Aug. 5, 2004

Related U.S. Application Data

(63) Continuation of application No. 10/323,789, filed on Dec. 20, 2002, now Pat. No. 6,696,994.

(30) Foreign Application Priority Data

Dec. 21, 2001  (KR) .............................. 2001-82844

(51) Int. Cl.
*H03M 5/06* (2006.01)
(52) U.S. Cl. ....................................................... 341/68
(58) Field of Classification Search ................ 341/106, 341/107, 68; 375/240, 241, 246, 250, 264, 375/286; 358/426, 429, 430, 432; 382/238, 382/245
See application file for complete search history.

(56) References Cited

U.S. PATENT DOCUMENTS

| 5,506,581 A | 4/1996 | Ino |
| 6,055,273 A * | 4/2000 | Isomura ....................... 375/240 |
| 6,744,439 B1 * | 6/2004 | Laury et al. ................. 345/562 |

FOREIGN PATENT DOCUMENTS

JP        401181214 A *   7/1989    ................ 708/270

* cited by examiner

*Primary Examiner*—Brian Young
(74) *Attorney, Agent, or Firm*—Birch, Stewart, Kolasch & Birch, LLP

(57) ABSTRACT

The present invention relates to method and apparatus of modulating a series of data words into (d,k) constrained sequence in order to record onto a recording medium. The present method generates, for each data word, a number of alternative sequences by combining mutually different digital words with the data word, calculates for each alternative sequence a digital sum value (DSV) and a penalty based on respective consecutive-zeros sections within the sequence and a joining consecutive "zeros" to a previously-selected sequence, and selects one alternative sequence for recording onto a recordable medium based on the calculated DSV and penalties. Owing to the present invention, DC component of sequences to be recorded onto a recording medium is suppressed and stabilization of a reproduction clock is improved through writing more edge information (i.e., "1"s).

11 Claims, 2 Drawing Sheets

Conventional Art

METHOD AND APPARATUS OF CONVERTING A SERIES OF DATA WORDS INTO MODULATED SIGNALS

BACKGROUND OF THE INVENTION

This application is a Continuation of co-pending application Ser. No. 10/323,789, filed on Dec. 20, 2002 is now a U.S. Pat. No. 6,696,994, the entire contents of which are hereby incorporated by reference and for which priority is claimed under 35 U.S.C. § 120; and this application claims priority of Application No. 2001-0082844 filed in Korea on Dec. 21, 2001 under 35 U.S.C. § 119.

FIELD OF THE INVENTION

The present invention relates to method and apparatus of modulating a series of data words into (d,k) constrained sequence in order to record onto a recording medium such as magnetic, magneto-optical, or optical disk.

DESCRIPTION OF THE RELATED ART

In general, when data is recorded onto a magnetic, magneto-optical, or optical medium, the data is modulated into a coded sequence matching the recording medium prior to the recording. However, if the coded sequence resulting from the modulation contains a direct current (DC) component, a variety of error signals such as tracking errors generated in control of a servo of the disk drive become prone to variations or jitter are generated easily.

The first reason for using said dc-free signals in recording onto a medium is that recording channels are not normally responsive to low-frequency components. The suppression of low-frequency components in the signal is also highly advantageous when the signal is read from an optical record carrier on which the signal is recorded in the track, because then continuous tracking control undisturbed by the recorded signal is possible.

A good suppression of the low-frequency components leads to improved tracking with less disturbing audible noise. For this reason it is thus desirable to make as many efforts to prevent the modulated sequence from containing a direct current component as possible.

In order to prevent the modulated sequence from containing a direct current component, control of a DSV (Digital Sum Value) has been proposed. This well-known method is explained briefly.

FIG. 1 shows a block diagram of a general coding system. The coding system includes a generator 10 generating a number of codeword candidates for each input data word; and a selector 20 selecting a codeword with the smallest DSV among the candidates.

FIG. 2 shows a detailed block diagram of the coding system. As shown in FIG. 2, the generator 10 includes an augmentor 100 and a plurality of NRZI coders 101 to 116 while the selector 20 includes a plurality of codeword memories $201_1$ to $216_1$, and a plurality of DSV calculators $202_1$ to $216_2$, and a selecting unit 220.

The augmentor 100 generates for each input word a number of codeword candidates by combining mutually different digital words with the data word and then scrambles them individually. The codeword candidates can be generated simply by placing the mutually different digital words in front, middle, or rear of the input data word. If a 4-bit digital word is used 16 candidates are generated by the augmentor 100. The NRZI coders 101 to 116 conduct NRZI pre-coding for the respective codeword candidates. The binary "zeros" outputted from each coder represent no (magnetic flux or electrical intensity) change, while binary "ones" represent transitions from one direction of recorded flux to the opposite direction.

The codeword candidates from the generator 10 are stored in the respective codeword memories $201_1$ to $216_1$. Each of the DSV calculators $201_2$ to $216_2$ calculates DSV of the codeword candidate stored in a corresponding memory and adds the calculated DSV to a total DSV accumulated from previously selected successive codewords. Each finally-calculated total DSV is applied to the selecting unit 220.

Then, the selecting unit 220 compares the inputted final DSVs each other from the DSV calculators $201_2$ to $216_2$ to determine the smallest final DSV. The codeword candidate associated with the determined final DSV is selected. Consequently, a codeword with the smallest DSV is outputted from the selector 20. This process enables a series of codewords with the least DC component to be recorded onto a recordable medium.

However, if the number of consecutive "0"s within a codeword and the number of linking "0"s between the last "1" of the first codeword and the first "1" of the second in are not limited in the above modulating process, a codeword with relatively long "0"s may be selected. If such a codeword is chosen frequently, there will be too long an unbroken string of contiguous "0"s with no interspersed "1"s during reproduction, so that the clock regenerating phase-locked-loop (PLL) will fall out of synchronism, which possibly causes data error or reproduction fail.

SUMMARY OF THE INVENTION

It is an object of the present invention to provide a coding system being able to limit the number of consecutive "0"s between two "1"s in the process of generating a number of codeword candidates for each input data word and selecting a codeword candidate to suppress DC component.

An apparatus of converting a series of data word into a modulated signal in accordance with the present invention is characterized in that it comprises a generator generating for each data word a number of alternative sequences by combining mutually different digital words with the data word; a first calculator calculating a digital sum value for each alternative sequence; a second calculator calculating for each alternative sequence a penalty based on respective consecutive-zeros sections; and a selector selecting one alternative sequence for recording onto a recordable medium based on the calculated digital sum values and penalties.

A method of converting a series of data word into a modulated signal in accordance with the present invention is characterized in that it comprises the steps of: generating for each data word a number of alternative sequences by combining mutually different digital words with the data word; calculating, for each alternative sequence, a digital sum value and a penalty based on respective consecutive-zeros sections; and selecting one alternative sequence for recording onto a recordable medium based on the calculated digital sum values and penalties.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the present invention, illustrate the preferred embodiments of the invention, and together with the description, serve to explain the principles of the present invention, and wherein.

DETAILED DESCRIPTION OF THE PREFERRED EMBODIMENT

In order that the present invention may be fully understood, a preferred embodiment thereof will now be described with reference to the accompanying drawings.

Figure 1:
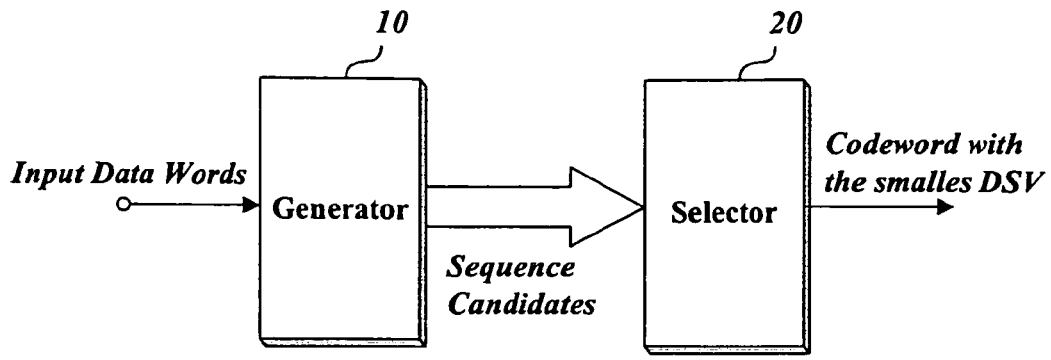
FIG. 1 shows a block diagram of a general coding system.
Figure 2:
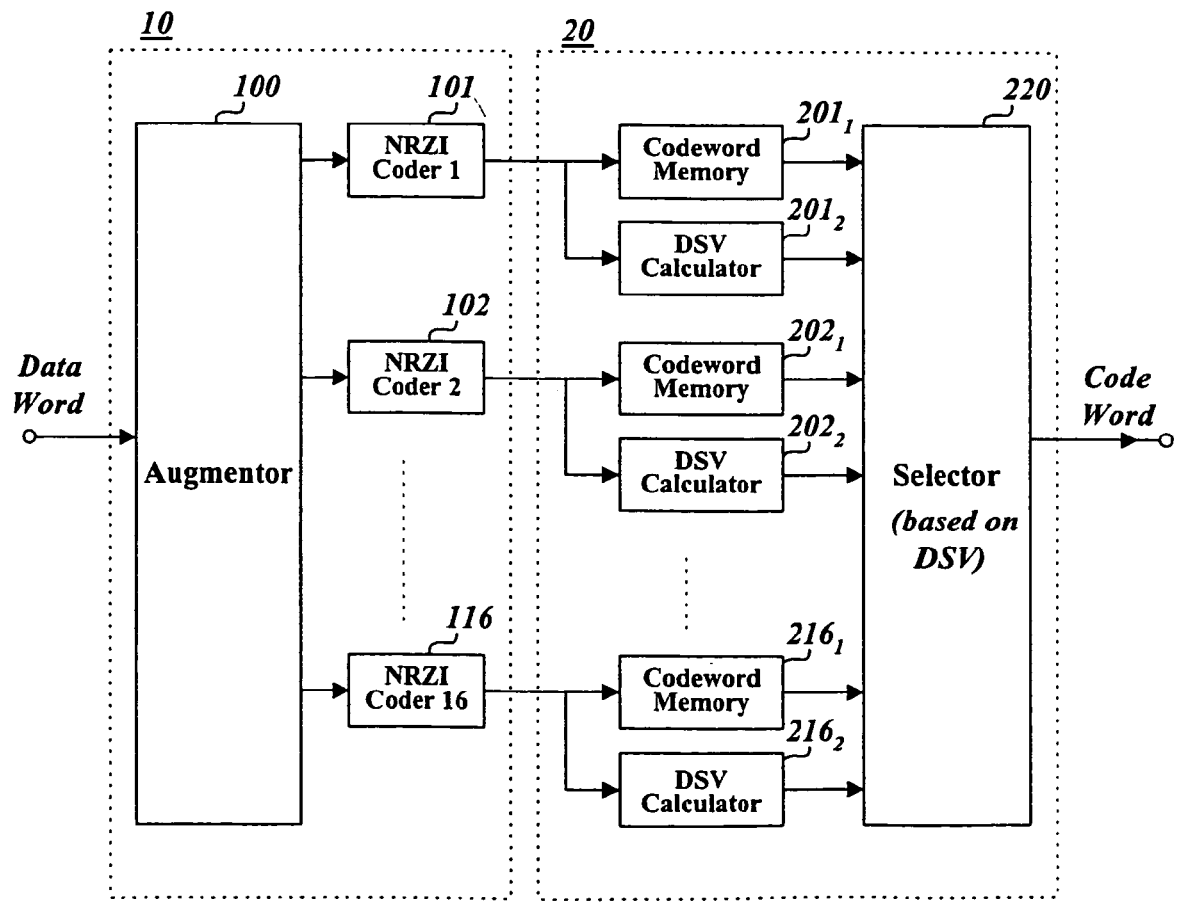
FIG. 2 shows a detailed block diagram of the general coding system.
Figure 3:
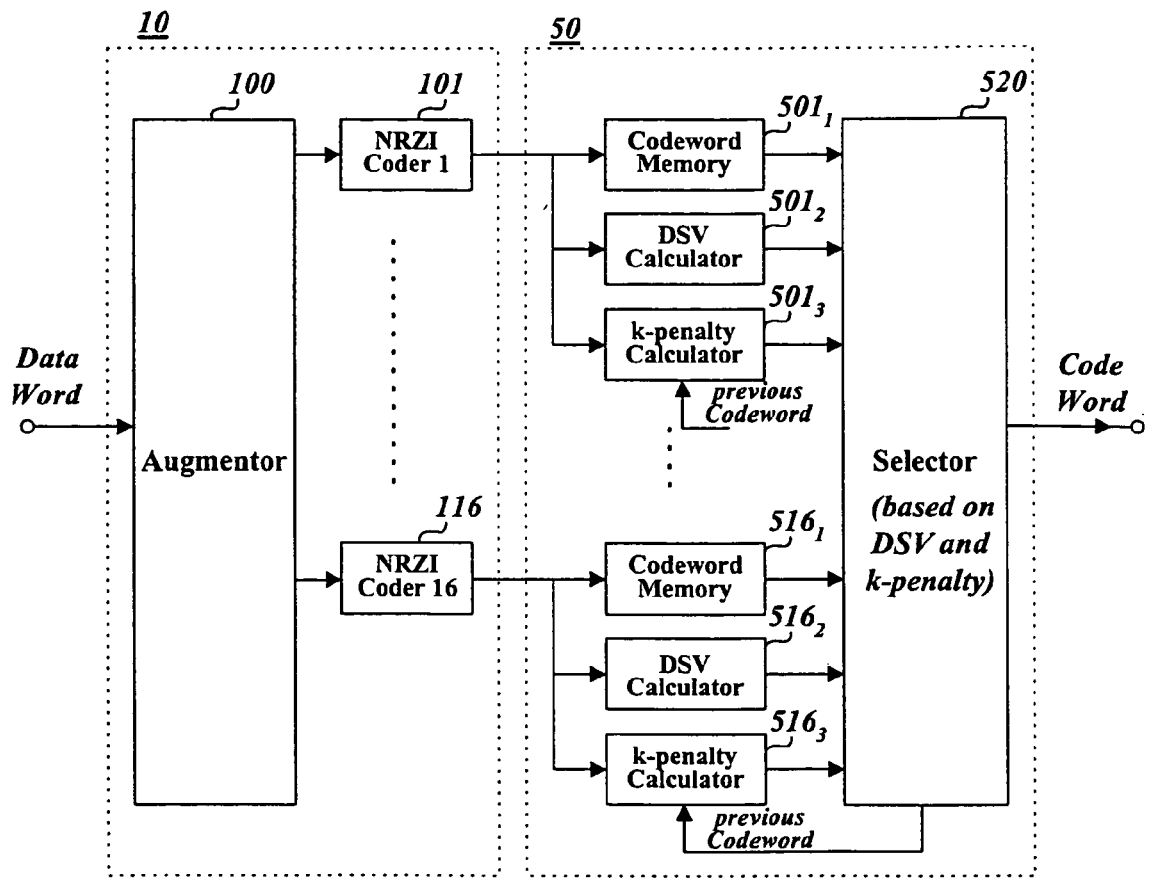
FIG. 3 shows a detailed block diagram of a coding system in accordance with the present invention.

FIG. 3 shows a detailed block diagram of a coding system in accordance with the present invention. The coding system of FIG. 3 is composed of a generator 10 and a selector 50. The generator 10 is composed of an augmentor 100 and a plurality of NRZI coders 101 to 116 as in the conventional coding system of FIG. 2. The selector 50 includes a plurality of codeword memories $501_1$ to $516_1$, and a plurality of DSV calculators $501_2$ to $516_2$, a plurality of k-penalty calculators $501_3$ to $516_3$, and a selecting unit 520.

Each of the k-penalty calculators $501_3$ to $516_3$ calculates k-penalty of a codeword candidate in proportion to consecutive "0"s within a codeword and linking "0" runs between two consecutive "1"s of two successive codewords under a given run length limited codes, generically designated as (d,k) codes. A (d,k) code means constraints that at least d "zeros" are inserted between successive data "ones", and no more than k "zeros" are inserted between successive data "ones".

The selecting unit 520 calculates a total penalty for each codeword candidate from the final DSV calculated by each DSV calculator and k-penalty calculated by each k-penalty calculator, and then chooses one codeword candidate with the smallest total penalty among the candidates for recording onto a recordable medium. The above processes are described below in detail.

The augmentor 100 of the generator 10 generates for each word a number of codeword candidates by combining mutually different digital words, (e.g., 16 words of '0000', '0001','0010', . . . and '1111') with the data word and scrambles them individually. The codeword candidates can be generated simply by placing the mutually different digital words in front, middle, or rear of the input data word. The NRZI coders 101 to 116 conduct NRZI pre-coding for the respective codeword candidates as explained before.

The codeword candidates from the generator 10 are stored in the respective codeword memories $501_1$ to $516_1$. Each of the DSV calculators $501_2$ to $516_2$ calculates DSV of the codeword candidate stored in a corresponding memory and adds the calculated DSV to a total DSV accumulated from previously-selected successive codewords. The finally-calculated total DSVs are respectively applied to the selecting unit 520.

Each of the k-penalty calculators $501_3$ to $516_3$ counts respective "0"-runs sections within a codeword candidate stored in the corresponding memory and further counts runs of consecutive "0"s linking between the last "1" of a previously-chosen codeword by the selecting unit 520 and the first "1" of the concerned codeword candidate. Then, the k-penalty calculator imposes a k-penalty to the concerned candidate in consideration of the respective counts.

That is, the k-penalty calculator compares each count Ki with two references n and m (0<n<m). If Ki is between n and m inclusive, it is multiplied by a weighting factor Wa, and if Ki is greater than m it is multiplied by another weighting factor Wb (>Wa). After the Pi (=Ki×(Wa or Wb)) is calculated for each consecutive "0"s, it is summed altogether to obtain total k-penalty Kpen $$\left( = \sum_i P_i \right).$$

If all of the counts Ki are smaller than n, the k-penalty Kpen is set to 0.

For example, if the concerned codeword candidate is "001001000010000001" and the previously-selected codeword is "100100101000001000", respective counts of consecutive-"0"s sections are 5, 2, 4, and 6 in turn. Supposing that Wa=0.3, Wb=0.6, n=3, and m=5, 4 and 5 between n and m inclusive are multiplied respectively by Wa=0.3, and the count 6 beyond m is multiplied by Wb=0.6. The respective results are then summed to 6.9 (=Kpen=Wa×Ki+Wb×Ki=0.3×(4+5)+0.7×6) that is k-penalty.

A coding system can be designed by a designer who develops a disk recording device such that the weighting factors Wa and Wb are adjustable.

As another embodiment of k-penalty calculation, the longest consecutive "0"s only may be considered irrespective of other remaining "0" runs.

The selecting unit 520 compares the inputted final DSVs and the k-penalties (Kpen) from the DSV calculators $501_2$ to $516_2$ and the k-penalty calculators $501_3$ to $516_3$ to select a codeword optimal to DSV control and PLL locking. That is, a codeword satisfying smaller DSV and shorter consecutive "0"s at the same time is selected.

For selecting a codeword among a plurality of candidates in consideration of DSV and k-penalty, sum of two values can be compared each other. In this embodiment, a codeword candidate with the smallest sum of DSV and k-penalty assigned as above is selected for recording onto a recording medium such as magnetic, magneto-optical, or optical disk.

Instead of simple summation of the two values of DSV and k-penalty, the two values may be summed after they are multiplied by adequate weight factors, respectively.

The method and apparatus of converting a series of data words into a modulated signal according to the present invention not only can suppress DC component of sequences to be recorded onto a recording medium but also can improve stabilization of a reproduction clock through writing edge information (i.e., "1") as frequently as it can.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An apparatus of converting a series of data word into a modulated signal, comprising:
   a generator generating for each data word a number of alternative sequences by combining mutually different digital words with the data word;
   a first calculator calculating a digital sum value for each alternative sequence;
   a second calculator calculating for each alternative sequence a penalty based on respective consecutive-zeros sections, wherein the longest consecutive zeros are considered to calculate the penalty; and
   a selector selecting one alternative sequence for recording onto a recordable medium based on the calculated digital sum values and penalties.

2. The apparatus of claim 1, wherein said generator comprises:
   an augmentor generating for each data word $2^N$ intermediate sequences by combining the N-bit digital words with the data word; and
   a coder conducting NRZI coding for each generated intermediate sequence to produce the $2^N$ alternative sequences.

3. The apparatus of claim 1, wherein said second calculator calculates the penalty in further consideration of joining consecutive zeros between each alternative sequence and a previously-selected sequence by said selector.

4. The apparatus of claim 1, wherein said second calculator, for each alternative sequence, counts respective consecutive-zeros sections, compares each count with a reference, multiplies each count by a weighting factor determined from the comparison, and sums the multiplied results altogether to produce said penalty.

5. The apparatus of claim 1, wherein said selector selects one alternative sequence with the smaller digital sum value and the shorter penalty among the generated plural alternative sequences to record onto a recordable medium.

6. A method of converting a series of data word into a modulated signal, comprising the steps of:
   (a) generating for each data word a number of alternative sequences by combining mutually different digital words with the data word;
   (b) calculating, for each alternative sequence, a digital sum value and a penalty based on respective consecutive-zeros sections, wherein the longest consecutive zeros are considered to calculate the penalty; and
   (c) selecting one alternative sequence as a modulated data based on the calculated digital sum values and penalties.

7. The method of claim 6, wherein said step (a) generates for each data word $2^N$ intermediate sequences by combining the N-bit digital words with the data word, and conducts NRZI coding for each generated intermediate sequence to produce the $2^N$ alternative sequences.

8. The method of claim 6, wherein said step (b) calculates the penalty in further consideration of joining consecutive zeros between each alternative sequence and a previously-selected sequence by said step (c).

9. The method of claim 7, wherein said step (b), for each alternative sequence, counts respective consecutive-zeros sections, compares each count with a reference, multiplies each count by a weighting factor determined from the comparison, and sums the multiplied results altogether to produce said penalty.

10. The method of claim 6, wherein said step (c) selects one alternative sequence with the smaller digital sum value and the shorter penalty among the generated plural alternative sequences to record onto a recordable medium.

11. A recording medium, including at least one sequence that has been recorded thereon through the following steps of:
   generating for each data word a number of alternative sequences by combining mutually different digital words with the data word;
   calculating, for each alternative sequence, a digital sum value and a penalty based on respective consecutive-zeros sections, wherein the longest consecutive zeros are considered to calculate the penalty; and
   selecting one alternative sequence for recording based on the calculated digital sum values and penalties.

* * * * *